(12) United States Patent
Jindai

(10) Patent No.: US 10,155,269 B2
(45) Date of Patent: Dec. 18, 2018

(54) DRILL

(71) Applicant: Sumitomo Electric Hardmetal Corp., Itami-shi (JP)

(72) Inventor: Masaaki Jindai, Itami (JP)

(73) Assignee: Sumitomo Electric Hardmetal Corp., Itami-shi (JP)

(*) Notice: Subject to any disclaimer, the term of this patent is extended or adjusted under 35 U.S.C. 154(b) by 0 days.

(21) Appl. No.: 15/504,970

(22) PCT Filed: Sep. 9, 2015

(86) PCT No.: PCT/JP2015/075543
§ 371 (c)(1),
(2) Date: Feb. 17, 2017

(87) PCT Pub. No.: WO2016/043098
PCT Pub. Date: Mar. 24, 2016

(65) Prior Publication Data
US 2017/0274460 A1    Sep. 28, 2017

(30) Foreign Application Priority Data
Sep. 19, 2014  (JP) ................... 2014-191156

(51) Int. Cl.
*B23B 51/02* (2006.01)
*C23C 14/04* (2006.01)
(Continued)

(52) U.S. Cl.
CPC .............. *B23B 51/02* (2013.01); *C23C 14/04* (2013.01); *C23C 14/06* (2013.01);
(Continued)

(58) Field of Classification Search
CPC ................ B23B 51/02; B23B 2251/08; B23B 2251/082; B23B 2251/12;
(Continued)

(56) References Cited

U.S. PATENT DOCUMENTS

| 4,583,888 A | * | 4/1986 | Mori | ........................ B23B 51/02 408/144 |
| 5,628,837 A | * | 5/1997 | Britzke | .................... B23B 51/02 134/39 |
| 2007/0160437 A1 | | 7/2007 | Shultz et al. | |

FOREIGN PATENT DOCUMENTS

JP        60221208 A  *  1/1985
JP         6411703 A  *  1/1989
(Continued)

OTHER PUBLICATIONS

International Search Report in counterpart International Application No. PCT/JP2015/075543, dated Dec. 1, 2015.

*Primary Examiner* — Daniel Howell
*Assistant Examiner* — Chwen-Wei Su
(74) *Attorney, Agent, or Firm* — Venable LLP; Michael A. Sartori; Laura G. Remus

(57) ABSTRACT

In a drill, a negative land is provided on a rake face, and a ridge line at an intersecting position of the negative land and a flank face, a ridge line at an intersecting position of the flank face and a margin, and a ridge line at an intersecting position of the negative land and the margin are convex faces in a longitudinal rectangular cross section. When a curvature radius of the convex face of a first ridge line at the intersecting position of the flank face and the negative land is 1, at curvature radius of the convex face of a second ridge line at the intersecting position of the flank face and the margin is 0.8 to 1.5 times the curvature radius of the first ridge line, and a curvature radius of the convex face of a fourth ridge line at the intersecting position of the negative land and the margin is 1.5 to 3.0 times the curvature radius of the first ridge line.

7 Claims, 4 Drawing Sheets

(51) Int. Cl.
  *C23C 14/06* (2006.01)
  *C23C 14/22* (2006.01)
(52) U.S. Cl.
  CPC ....... *B23B 2224/24* (2013.01); *B23B 2228/08* (2013.01); *B23B 2228/10* (2013.01); *B23B 2251/082* (2013.01); *B23B 2251/122* (2013.01); *B23B 2251/125* (2013.01); *B23B 2251/14* (2013.01); *B23B 2251/408* (2013.01); *B23B 2251/44* (2013.01); *C23C 14/228* (2013.01); *Y10T 408/906* (2015.01); *Y10T 408/9097* (2015.01)
(58) Field of Classification Search
  CPC ......... B23B 2251/125; Y10T 408/9097; Y10T 408/909; Y10T 408/905; Y10T 408/906
  See application file for complete search history.

(56) References Cited

FOREIGN PATENT DOCUMENTS

| | | |
|---|---|---|
| JP | 2000-052121 A | 2/2000 |
| JP | 2007-007809 A | 1/2007 |
| JP | 2014-008549 A | 1/2014 |
| JP | 2014-018883 A | 2/2014 |

\* cited by examiner

DRILL

TECHNICAL FIELD

The present invention relates to a drill whose life is extended by devising edge tip treatment.

BACKGROUND ART

Drills, especially, a drill formed of cemented carbide that is more brittle than high-speed steel is subjected to edge tip treatment to reinforce a cutting edge for longer life.

The cutting edge can be reinforced by removing a sharp portion of t e edge tip, for example by chamfering or honing.

In edge tip treatment for reinforcement described in, for example, PTL 1 below, a cutting edge of a twist drill is chamfered to be a combination of a straight face and a curved face or to be a curved face. The curved part of the chamfered portion is mirror-finished or satin-finished to suppress floating of hard particles on the surface of the curved part.

CITATION LIST

Patent Literature

PTL 1: Japanese Unexamined Patent Application Publication No. 2000-52121

SUMMARY OF INVENTION

Technical Problem

As described in PTL 1, the edge tip is generally reinforced by cutting a rake face and a flank face along the cutting edge to dull the edge tip. In such treatment, however, it is difficult to suppress damage to an outer peripheral portion of the cutting edge.

In the conventional typical edge tip treatment, chipping resistance is insufficient in the outermost peripheral portion of the cutting edge where the cutting speed is the highest, particularly at ridge lines at an intersecting position of the flank face and the chamfered face and at an intersecting position of the flank face and a margin.

For this reason, fine chipping is caused in the outer peripheral portion of the cutting edge by repetition of microvibrations during treatment. This triggers progress of wear and damage.

An object of the present invention is to make the life of a drill longer than the life of a conventional drill subjected to general edge tip treatment by suppressing wear and damage in an outer peripheral portion of a cutting edge of the drill.

Solution to Problem

In a drill according to a mode of the present invention that is provided as a solution to the above-described problem, a negative land for edge tip reinforcement is provided on a rake face, and a ridge line at an intersecting position of the negative land and a flank face, a ridge line at an intersecting position of the flank face and a margin, and a ridge line at an intersecting position of the negative land and the margin are convex faces in a longitudinal rectangular cross section. When a curvature radius of the convex face of a first ridge line at the intersecting position of the flank face and the negative land is 1, a curvature radius of the convex face of a second ridge line at the intersecting position of the flank face and the margin is 0.8 to 1.5 times the curvature radius of the first ridge line, and a curvature radius of the convex face of a fourth ridge line at the intersecting position of the negative land and the margin is 1.5 to 3.0 times the curvature radius of the first ridge line.

Advantageous Effects of Invention

In the drill according to the mode of the present invention, fine chipping rarely occurs in an outer peripheral portion of a cutting edge, and early wear triggered by fine chipping is suppressed. This greatly extends the life.

DESCRIPTION OF EMBODIMENTS

Details of Embodiment of Invention

Figure 1:
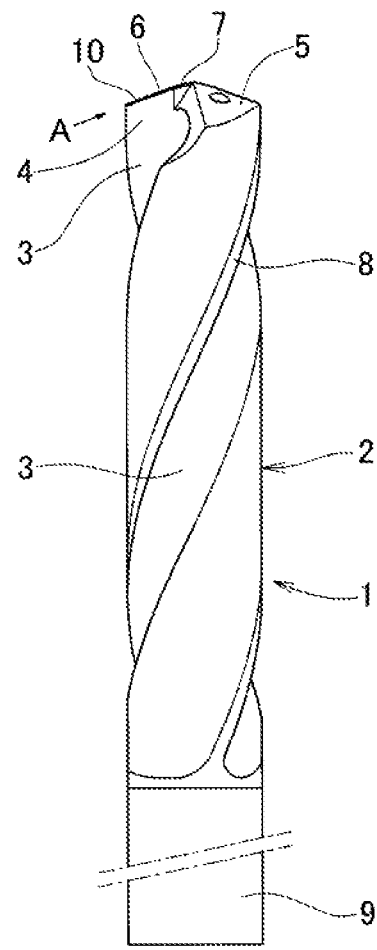
FIG. 1 is a side view of an example of a drill according to an embodiment of the present invention.

In a drill according to an embodiment of the present invention, a negative land for edge tip reinforcement is provided on a rake face. A ridge line at an intersecting position of the negative land and a flank face, a ridge line at an intersecting position of the flank face and a margin, and a ridge line at an intersecting position of the negative land and the margin are convex faces in a longitudinal rectangular cross section. When a curvature radius of the convex face of a first ridge line at the intersecting position of the flank face and the negative land is 1, a curvature radius of the convex face of a second ridge line at the intersecting position of the flank face and the margin is 0.8 to 1.5 times the curvature radius of the first ridge line, and a curvature radius of the convex face of a fourth ridge line at the intersecting position of the negative land and the margin is 1.5 to 3.0 times, the curvature radius of the first ridge line.

In this way, the ridge line at the intersecting position of the negative land and the flank face, the ridge line at the intersecting position of the flank face and the margin, and the ridge line at the intersecting position of the negative land and the margin are formed by convex faces, and when the curvature radius of the convex face of the first ridge line at the intersecting position of the flank face and the negative land is 1, the curvature radius of the convex face of the second ridge line at the intersecting position of the flank face and the margin is 0.8 to 1.5 times the curvature radius of the first ridge, and the curvature radius of the convex face of the fourth ridge line at the intersecting position of the negative land and the margin is 1.5 to 3.0 times the curvature radius of the first ridge line. In such a drill, fine chipping rarely occurs in an outer peripheral portion of a cutting edge, and early wear triggered by fine chipping is suppressed. This greatly extends the life.

Details of Embodiment of Invention

A specific example of a drill according to an embodiment of the present invention will be described below with reference to the attached drawings of FIGS. 1 to 5. It Should be noted that the present invention is limited to these illustrations. The scope of the present invention is defined by the claims, and it is intended to include all modifications within the scope of the claims and the equivalents thereof.

An illustrated drill 1 is a two-flute twist drill. A flute face near a distal end of a helical flute 3 provided on an outer periphery of a body part 2 serves as a rake face 4.

A cutting edge 6 is formed by a ridge line at an intersecting position of the rake face 4 and a distal flank face 5 and a ridge line at an intersecting position of the flank face 5 and a groove face of a web thinning portion 7 provided at the center of the distal end of the body part 2. Reference numerals 8 and 9 denote a margin and a shank continuing rearward from the body part 2, respectively.

Figure 2:
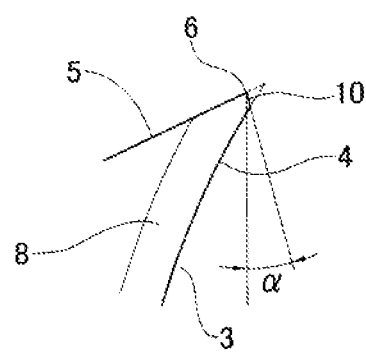
FIG. 2 is an enlarged side view of an outer end portion of a cutting edge as viewed from a direction of arrow A of FIG. 1.
Figure 3:
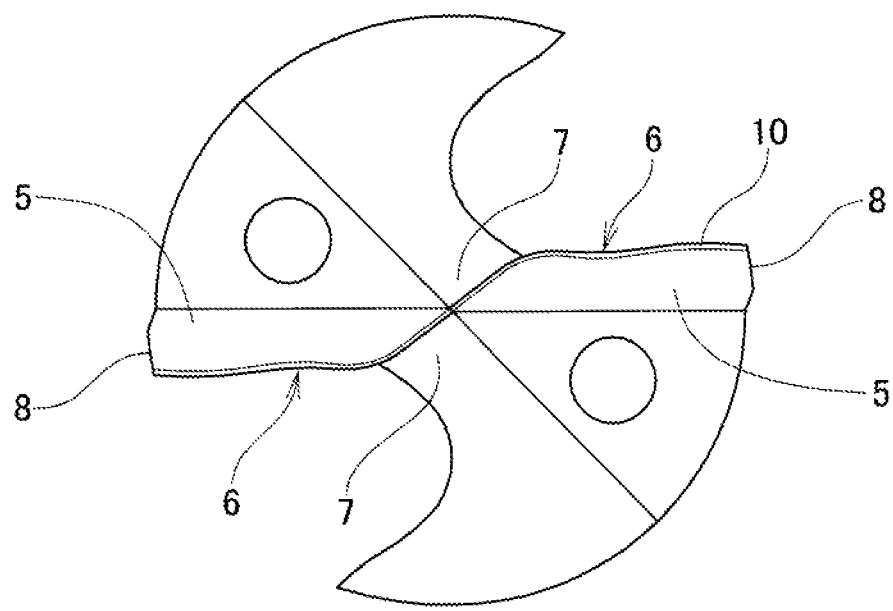
FIG. 3 is a front view of the drill of FIG. 1.
Figure 4:
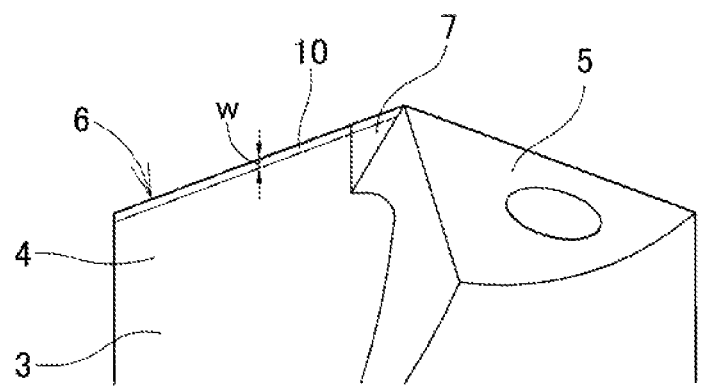
FIG. 4 is an enlarged side view of a part of FIG. 1.
Figure 5:
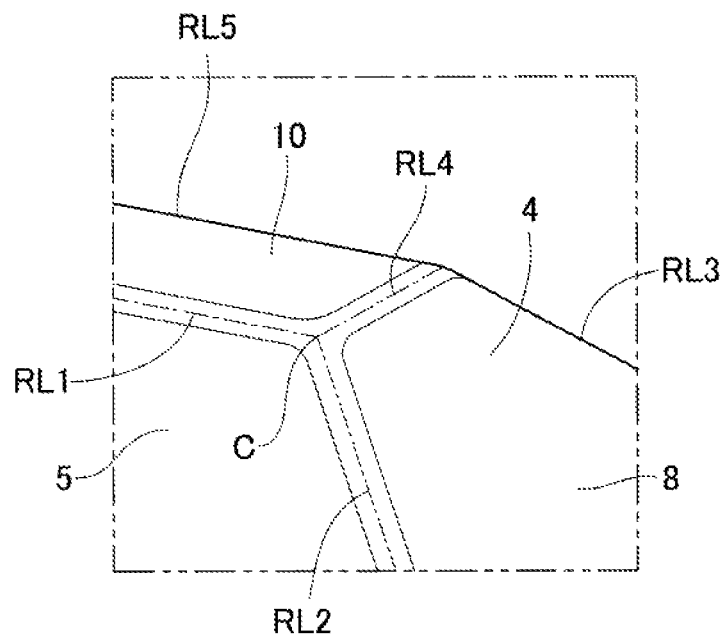
FIG. 5 is an enlarged perspective view of a corner part in the outer end portion of the cutting edge.

The drill 1 has a negative land 10 for edge tip reinforcement on the rake face 4. As illustrated in FIG. 2, the negative land 10 provided in the illustrated drill is inclined by a predetermined angle α in a negative direction (a direction opposite from the helical direction of the helical flute 3) with respect to the axis of the drill.

The angle α is set at about −15° to −35° with consideration for the balance between sharpness of the cutting edge and edge tip reinforcement.

A width w of the negative land 10 when viewed from a direction perpendicular to the axis (see FIG. 4) is set at about 0.03 to 0.15 mm. By selecting this numerical range, the edge tip can be reinforced while ensuring sharpness.

Figure 6:
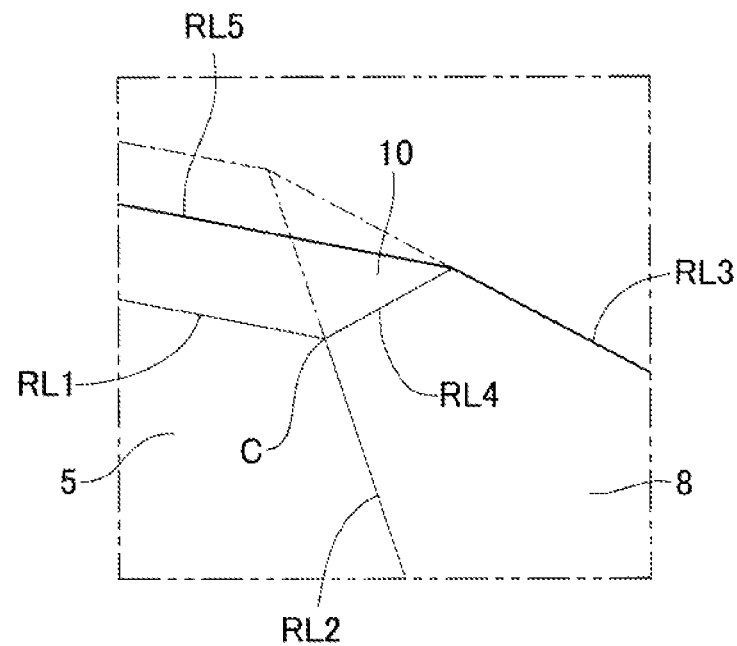
FIG. 6 is a perspective view dills illustrating a state before ridge lines between faces in the corner part of FIG. 5 are rounded.

By forming the negative land 10 on the rake face, a region of the margin 8 shown by a one-dot chain line in FIGS. 2 and 6 is removed. As illustrated in FIG. 6, a corner C at which three faces of the negative land 10, the flank face 5, and the margin 8 intersect is formed at the most distal end portion of the margin 8.

In conventional edge tip treatment, it seems that wear of the outer peripheral portion of the cutting edge is accelerated by reduction in sharpness because a tip of the corner C is easily chipped, fine chipping starts from the tip, and a damaged portion spreads.

The present invention was made by examining the measures to effectively suppress wear and damage in the outer peripheral portion of the cutting edge. As a result, it was found to be of effective to form a first ridge line RL1, a second ridge line RL2, and a fourth ridge line RL4 at intersecting positions of three faces of the flank face 5, the margin 8, and the negative land 10) in the shape of convex faces in a longitudinal rectangular cross section. These ridge lines are rounded to be convex faces.

The first ridge line RL1 is a ridge line at the intersecting position of the flank face 5 and the negative land 10, the second ridge line RL2 is a ridge line at the intersecting position of the flank face 5 and the margin 8, and the fourth ridge line RL4 is a ridge line at the intersecting, position of the negative land 10 and the margin 8.

A third ridge line RL3 at an intersecting position of the rake face 4 and the margin 8 and a fifth ridge line RL5 at an intersecting position of the negative land 10 and the rake face 4 may also be subjected to rounding similarly to the first ridge line RL1, the second ridge line RL2, and the fourth ridge line RL4. The fifth ridge line RL5 is also reinforced by rounding.

The curvature radii of the convex faces of the first to fourth ridge lines RL1 to RL4 in the longitudinal rectangular cross section are preferably 0.01 mm or more. By setting the curvature radii at 0.01 mm or more, a so-called film skipping phenomenon (a portion in which a film is not deposited is formed) can be suppressed and the ridge lines can also be properly coated when the present invention is applied to a coating drill whose surface is provided with a highly wear-resistant hard coating of, for example, TiAl.

The curvature radii of the convex faces of the ridge lines are given as the ratios to the curvature radius of the first ridge line RL1 when the curvature radius is 1. It was good that the curvature radii of the second ridge line RL2 and the third ridge line RL3 were 0.8 to 1.5 times the curvature radius of the first ridge line RL1 and the curvature radius of the fourth ridge line RL4 was 1.5 to 3.0 times the curvature radius of the first ridge line RL1.

An adequate curvature radius of the first ridge line RL1 was 0.015 to 0.035 mm. A more preferable curvature radius of the first ridge line RL1 was 0.021 to 0.035 mm. In this range, fine chipping rarely occurs in the outer peripheral portion of the cutting edge, and early wear triggered h fine chipping is suppressed. This greatly extends the life. In the first ridge line RL1, the curvature radius on the outer peripheral side was preferably larger than the curvature radius on the rotation center side. By making the curvature radius on the rotation center side to be smaller, reduction in sharpness of the cutting edge can be suppressed. By setting the curvature radius on the outer peripheral side to be larger, the reinforcing effect for the corner C can be enhanced.

A preferable curvature radius of the second ridge line RL2 was 0.020 to 0.040 mm, and a preferable curvature radius of the fourth ridge line RL4 was 0.040 to 0.075 mm. In these ranges, fine chipping rarely occurs in the outer peripheral portion of the cutting edge, and early wear triggered by fine chipping is suppressed. This greatly extends the life.

EXAMPLES

A two-flute twist drill formed of cemented carbide and having the shape illustrated in FIGS. 1 to 5 was prototyped. A diameter D was 8 mm and a ratio L/D of in effective edge length L and the diameter D was 5. In the prototyped drill, a rake face along the cutting edge is provided with a negative land having an inclination angle α of −25° and a width w of 0.07 mm when viewed from a direction perpendicular to the axis.

Ridge lines (first ridge line RL1, second ridge line RL2, fourth ridge line RL4) between the negative land and a flank face, between the negative land and a margin, and between the flank face and the margin are rounded to be convex faces in a longitudinal rectangular cross section.

The ridge lines were rounded by inserting a distal end of the drill in polishing media powder and revolving and moving the drill in the direction perpendicular to the axis. For this reason, a third ridge line RL3 and a fifth ridge line RL5 are also rounded convex faces in a longitudinal rectangular cross section.

As the curvature radii of the convex faces of the first ridge line RL1, the second ridge line RL2, and the fourth ridge line RL4, the curvature radius of the first ridge line RL1 is about 0.025 mm, the curvature radius of the second ridge line RL2 is about 0.03 mm, and the curvature radius of the fourth ridge line RL4 is about 0.060 mm.

On a surface of the drill, a coating film of TiAl was formed by PVD after reinforcing treatment of the edge tip.

Workpieces were bored under the following conditions by using this prototyped drill and a comparative drill in which a negative land similar to that of the prototyped drill was formed on a rake face and a ridge line between the negative land and a flank face was rounded by honing (the comparative drill was different only in the treatment method for the ridge line from the prototyped drill).

Figure 8:
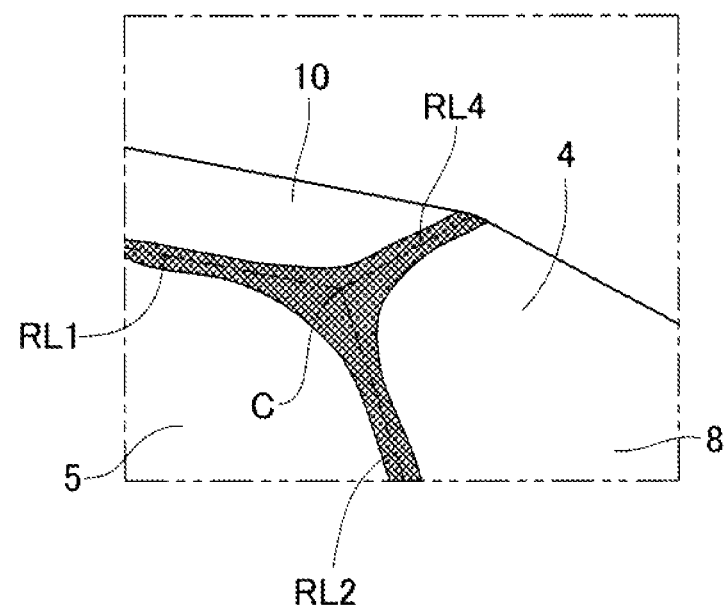
FIG. 8 is a perspective view illustrating a wear state of a corner part of an outer end portion of a cutting edge in a comparative drill used in the evaluation test.

Cutting Conditions
Workpiece: SSOC (HB230)
Cutting speed Vc=80 m/min
Feed f=0.25 mm/rev
Machined hole depth H=38 mm
Total cutting length: 36 m
Internal oil supply wet cutting As a result of this test the comparative drill was markedly worn in a hatched region a FIG. 8, that is, in regions near a corner of first ridge line RL1, a second ridge line RL2, and a fourth ridge line RL4 and a region along the first ridge line RL1.

Figure 7:
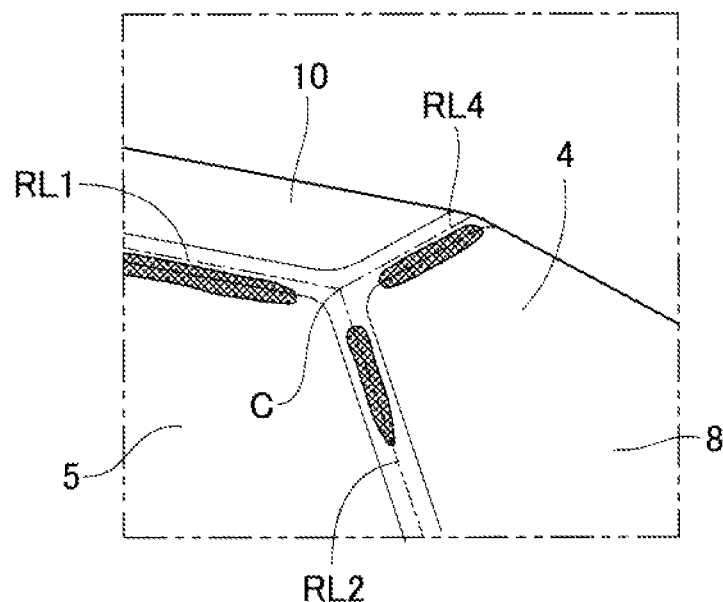
FIG. 7 is a perspective view illustrating a wear state of a corner part of an outer end portion of a cutting edge in a prototyped drill used in an evaluation test.

In contrast, as illustrated in FIG. 7, in the prototyped drill, pants of the rounder first ridge line RL1, second ridge line RL2, and fourth ridge line RL4 were just slightly worn.

The worn parts of the prototyped drill are slightly distant from the tip of the corner C. This is because the corner C was also rounded by rounding three ridge lines of the first ridge line RL1, the second ridge line RL2, and the fourth ridge line RL4 and the contact point of an outer end portion of the cutting edge with the workpiece retreated.

The worn parts are less likely to be chipped than the tip of the corner. Thus, the spread of fine chipping is s, and the wear speed of the corner at which three faces of the negative land, the flank face, and the margin intersect is lower than in the conventional drill.

While the drills used in the performance evaluation test are each a two-flute coating twist drill having a hard coating on its surface, the present invention is also applied to, for example, a drill having no hard coating, a drill having three or more flutes, and a straight drill in which a chip evacuation groove is not twisted.

REFERENCE SIGNS LIST

1 twist drill
2 body part
3 helical flute
4 rake face
5 flank face
6 cutting edge
7 web thinning portion
8 margin
9 shank
10 negative land
RL1 first ridge line at intersecting position of flank face and negative land
RL2 second ridge line at intersecting position of flank face and margin
RL3 third ridge line at intersecting position of rake face and margin
RL4 fourth ridge line at intersecting position of negative land and margin
RL5 fifth ridge line at intersecting position of negative land and rake face
α inclination angle of negative land
w width of negative land when viewed from direction perpendicular to axis
C corner at which three faces of negative land, flank face, and margin intersect

The invention claimed is:

1. A drill in which a negative land is provided on a rake face and a first ridge line at an intersecting position of the negative land and a flank face, a second ridge line at an intersecting position of the flank face and a margin, and a fourth ridge line at an intersecting position of the negative land and the margin are convex faces in a longitudinal rectangular cross section,
wherein, when a curvature radius of the convex face of the first ridge line is 1, a curvature radius of the convex face of the second ridge line is 0.8 to 1.5 times the curvature radius of the first ridge line, and a curvature radius of the convex face of the fourth ridge line is 1.5 to 3.0 times the curvature radius of the first ridge line, and
wherein the fourth ridge line at the intersecting position of the negative land and the margin is a convex face in a longitudinal rectangular cross section over an entire width direction of the negative land.

2. The drill according to claim 1, wherein the curvature radius of the convex face of the first ridge line is 0.015 to 0.035 mm.

3. The drill according to claim 1, wherein the curvature radius of the convex face of the first ridge line is 0.021 to 0.035 mm.

4. The drill according to claim 1, wherein the curvature radius of the convex face of the first ridge line is larger on an outer peripheral side than on a rotation center side.

5. The drill according to claim 1, wherein a width of the negative land is set at 0.03 to 0.15 mm when viewed from a direction perpendicular to an axis.

6. The drill according to claim 1, wherein a third ridge line at an intersecting position of the rake face and the margin is a convex face in the longitudinal rectangular cross section.

7. The drill according to claim 1, wherein a surface of the drill has a hard coating that is highly wear-resistant.

* * * * *